(12) United States Patent
Bouny

(10) Patent No.: US 8,854,143 B2
(45) Date of Patent: Oct. 7, 2014

(54) BIAS CIRCUIT

(71) Applicant: NXP B.V., Eindhoven (NL)

(72) Inventor: Jean-Jacques Bouny, Colomiers (FR)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/164,484

(22) Filed: Jan. 27, 2014

(65) Prior Publication Data

US 2014/0210557 A1    Jul. 31, 2014

(30) Foreign Application Priority Data

Jan. 28, 2013 (EP) ...................................... 13290021

(51) Int. Cl.
*H03F 3/04* (2006.01)
*H03F 1/02* (2006.01)

(52) U.S. Cl.
CPC .................................... *H03F 1/0205* (2013.01)
USPC ........................................... 330/296; 330/285

(58) Field of Classification Search
USPC .......................................... 330/296, 285, 288
See application file for complete search history.

(56) References Cited

U.S. PATENT DOCUMENTS

| | | | |
|---|---|---|---|
| 5,060,294 A | 10/1991 | Schwent et al. | |
| 6,873,211 B1 | 3/2005 | Thompson et al. | |
| 8,253,492 B2 * | 8/2012 | Hijikata et al. | 330/285 |
| 2003/0146790 A1 | 8/2003 | Arell et al. | |
| 2004/0174213 A1 | 9/2004 | Thompson | |
| 2008/0204146 A1 | 8/2008 | Bouny | |
| 2009/0224834 A1 * | 9/2009 | Young et al. | 330/296 |
| 2010/0201449 A1 * | 8/2010 | Hasegawa | 330/291 |
| 2014/0097905 A1 * | 4/2014 | Xu et al. | 330/296 |

FOREIGN PATENT DOCUMENTS

WO    2008/041063 A1    4/2008

OTHER PUBLICATIONS

Jarvinen, E., et al; "Bias Circuits for GaAs HBT Power Amplifiers"; IEEE MTT-S Digest; 4 pages (2001).
Extended European Search Report for appln. No. 13290021.8 (Jul. 19, 2013).

* cited by examiner

*Primary Examiner* — Henry Choe

(57) ABSTRACT

Proposed is a bias circuit for a transistor in a C class amplifier. The bias circuit comprises: a class AB amplifier bias voltage generating means adapted to generate a bias voltage at an output terminal; and a transistor connected between the output terminal and a first reference voltage, the control terminal of the transistor being connected to a second reference voltage via a switch. Closure of the switch connects the second reference voltage to the control terminal of the transistor to cause a shift in the bias voltage generated by the class AB amplifier bias voltage generating means to achieve a predetermined class C bias voltage at the output terminal.

12 Claims, 6 Drawing Sheets

BIAS CIRCUIT

FIELD OF THE INVENTION

This invention relates to a bias circuit for a Radio Frequency (RF) power transistor.

CROSS-REFERENCE TO RELATED APPLICATIONS

This application claims the priority under 35 U.S.C. §119 of European patent application no. 13290021.8, filed on Jan. 28, 2013, the contents of which are incorporated by reference herein.

BACKGROUND OF THE INVENTION

In the field of RF power amplification, with the increasing complexity of signals to be amplified (such as GSM, WCDMA, LTE, etc. . . . ) and the demand for efficiency, the preferred mode of operation of a RF transistor is a common source (emitter) class AB linear amplifier.

In order to maintain linearity, it is known to use a bias circuit to provide thermal compensation. This has been implemented in MMIC's using the well-known current mirror arrangement of transistors. When integrated on the same die as a RF power transistor, this provides thermal tracking and process compensation.

With the continued drive to further increase efficiency and reduce the size and cost of amplifiers, Doherty amplifiers are now widely used because of their advantages in efficiency in back-off. In its simplest configuration, a Doherty amplifier consists of two amplifiers, namely a main (or carrier) amplifier and an auxiliary (or peaking amplifier) connected in parallel with their outputs joined by a quarter-wave transmission line. The main amplifier is typically a Class B or Class AB type linear power amplifier and the auxiliary amplifier is typically a Class C type non-linear power amplifier.

Thus, to be suitable for Doherty amplifier, a bias circuit has to be able to provide a Class C bias level, which corresponds to a class AB level from which a fixed voltage is subtracted. A conventional current mirror (like that shown in FIG. 1 for example) is therefore not suitable for Class C.

BRIEF SUMMARY OF THE INVENTION

According to an aspect of the invention there is provided a bias circuit according to claim 1.

There is proposed a bias circuit that employs a transistor connected between the output of the bias circuit and a reference voltage (such as ground, for example). The transistor may be adapted to act as a non-linear load and may allow quick discharge of load capacitance in a switching mode. Thus, embodiments may provide fast thermal tracking and process compensation together with low video impedances. Embodiments may also be compact in size, exhibit lower power consumption, and provide a reduced switching time (such as below 100 ns for example). Embodiments may therefore be employed in MMIC's or discrete transistors, and will be suitable for Doherty amplifiers and Time Division (TD)) amplifiers.

Embodiments may comprise class AB amplifier bias voltage generating means employing a current mirror. The current mirror may comprise first and second MOS transistors that are provided in a looped arrangement, wherein the drain of the first MOS transistor is connected to a current source (which could be a voltage source connected via a reference resistor), and wherein the gate of the second MOS transistor is connected to the drain of the first MOS transistor, such that the source of the second MOS transistor provides the bias voltage.

Embodiments may be formed in an integrated circuit, and may further be integrated on the same circuit as a transistor to be biased.

Embodiments may be employed in a Doherty amplifier.

A radio frequency amplifier circuit may employ an embodiment.

According to another aspect of the invention, there is provided a method of biasing a transistor in a C class amplifier according to claim 11.

According to another aspect of the invention, there is provided a computer program product for biasing a transistor in a C class amplifier according to claim 12.

Embodiments may exhibit low impedance to prevent parasitic modulation appearing at the output (e.g. at the input of a transistor to be biased), thus restricting the generation of undesirable memory effects and non-linearity. Embodiments may compensate for part-to-part variation in the threshold voltage of an amplifier's transistor, thus reducing a need for adjustment of the bias circuit.

A bias circuit according to an embodiment may be included in various types of power amplifiers, such as those for cellular radio base-stations for example.

BRIEF DESCRIPTION OF THE DRAWINGS

Preferred embodiments of the present invention will now be described, by way of example only, with reference to the following drawings in which.

DETAILED DESCRIPTION OF THE EMBODIMENTS

Figure 1:
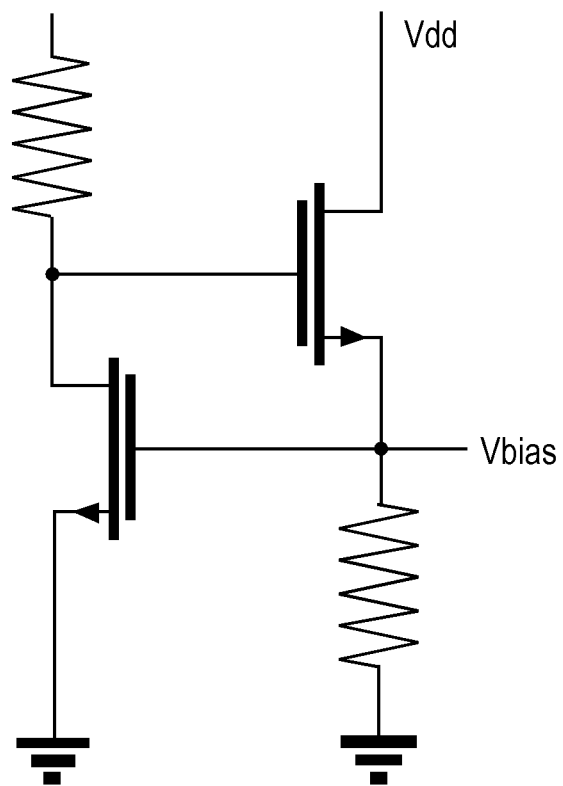
FIG. 1 shows an example of a conventional current mirror arrangement.

There is proposed a bias circuit which employs a current mirror circuit (similar to the conventional circuit arrangement shown in FIG. 1) to generate a bias voltage at an output terminal. The bias circuit also employs an additional transistor connected between the output terminal of the bias circuit and ground. This additional transistor can be controlled via a switch that is adapted to supply a control voltage to the control terminal (e.g. the gate) of the transistor.

Figure 2:
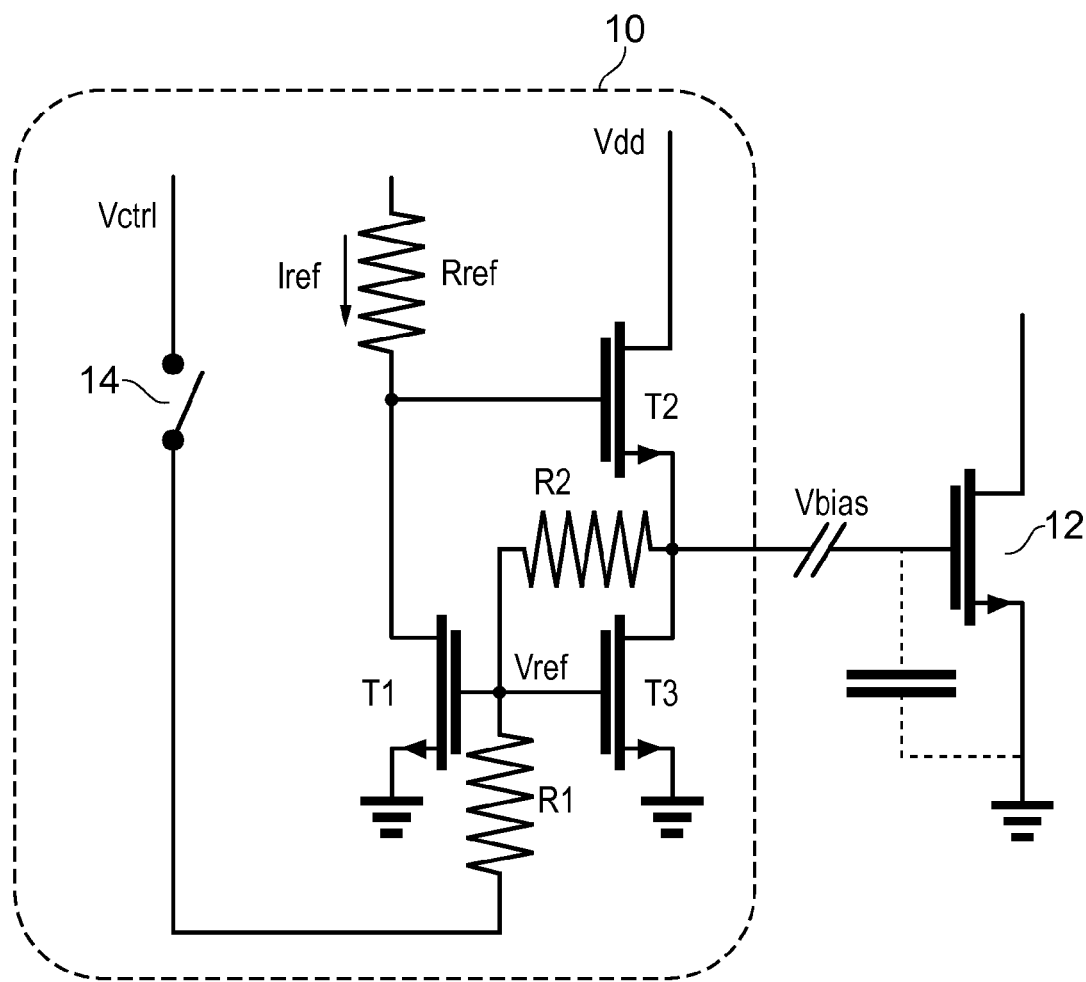
FIG. 2 is a schematic diagram of a bias circuit according to an embodiment.

An embodiment of a bias circuit 10 is shown in FIG. 2. The bias circuit 10 comprises first T1 and second T2 transistors which are scaled versions of a RF transistor T2 to be biased. The first T1 and second T2 transistors are provided in a looped arrangement, similar to that shown in FIG. 1, wherein the drain of the first transistor T1 is connected to a current source Iref. The voltage source Vdd is connected to the drain of the second transistor T2 and the gate of the second transistor T2 is connected to the drain of the first transistor T1. The source of the second transistor T2 provides the output Vbias of the bias circuit 10.

In use, the first transistor T1 acts as a reference, which has its bias point fixed by the reference current source IREF. The second transistor T2 operates as a voltage buffer for the first transistor T1, and provides current to the output (i.e. the RF transistor T2 to be biased) when necessary. For example, since the RF transistor T2 behaves like a capacitor, the bias circuit 10 may need to charge the RF transistor T2 in order to increase the bias voltage Vbias.

The looped arrangement of the first and second transistors T1 and T2 enables the voltage on the first transistor T1 to control the output bias voltage Vbias. Thus, the voltage output from the gate of the first transistor T1 is the class AB amplifier bias voltage (i.e. a reference voltage Vref).

In other words, the bias circuit 10 employs a conventional current mirror arrangement (like that shown in FIG. 1) wherein the reference transistor is the first transistor T1 in which a current Iref is injected corresponding to the desired class AB bias level. Like in a conventional current mirror (similar to that shown in FIG. 1), current is supplied to the output by the second transistor T2. It will be appreciated that in the case of MOS transistors, there is no DC current.

Having established a reference or class AB bias voltage (with the looped arrangement of the first and second transistors T1 and T2), it is necessary to subtract a voltage (Vdelta) from the reference voltage Vref for biasing a class C amplifier. To achieve this, a third transistor T3 is connected between bias circuit output and ground, with the control terminal (i.e. the gate) of the third transistor T3 being connected to the gate of the first transistor T1. Also, the gate of the first transistor T1 is connected to a switch via a first resistor R1, and connected to the output terminal (i.e. the source of the second transistor T2 via a second resistor R2. The switch 14 is adapted to selectively disconnect/connect the first resistor R1 to control voltage Vctrl.

When used in class AB, the switch 14 is in an open configuration and the control voltage Vctrl is not connected to the gate of the first transistor T1 via the first resistor R1, and the third transistor T3 then acts as an active load for the current mirror.

When used in class C, the switch 14 is in a closed configuration and the control voltage Vctrl is connected to the gate of the first transistor T1 via the first resistor R. The control voltage Vctrl translates through the first R1 and second R2 resistors into shift in voltage at the output terminal of the bias circuit (Vbias) and the third transistor T3 acts as a non-linear load.

When used in a switching mode, the third transistor T3 allows quick discharging of the load capacitance without affecting the bias circuit consumption in steady state mode.

Implementation of the third transistor T3 for generating the Class C bias voltage does not affect the functionality of the first T1 and second T2 transistor looped arrangement for generating the Class AB bias voltage.

Figure 3A:
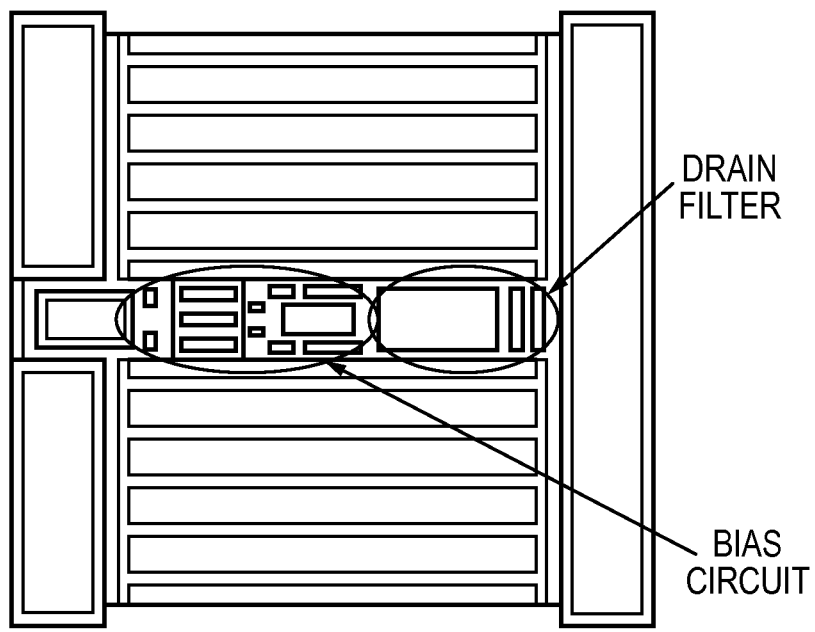
FIG. 3A illustrates an exemplary layout of an embodiment within a ten cells discrete die.
Figure 3B:
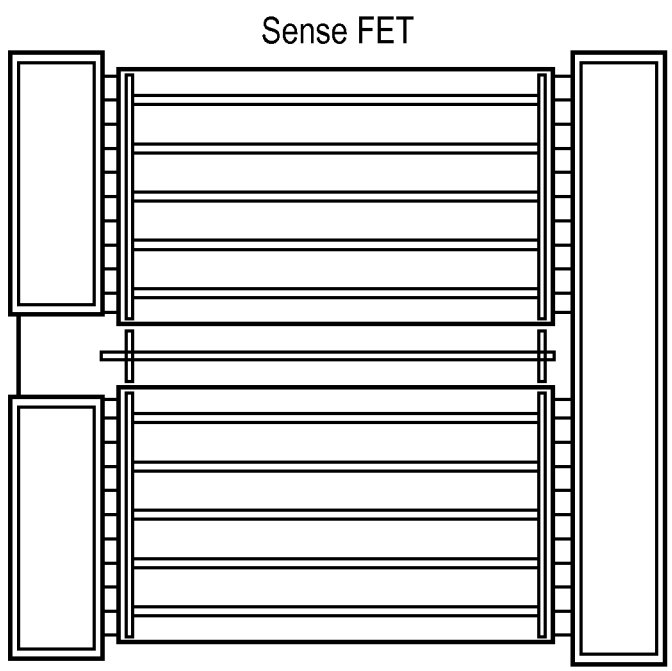
FIG. 3B illustrates an exemplary layout of a conventional sense FET within a ten cells discrete die.

An exemplary layout of an embodiment within a ten cells discrete die is shown in FIG. 3A, and the layout of a so called "sense FET" (widely used across base-station devices) within a ten cells discrete die is shown in FIG. 3B.

As can be seen from a comparison of FIGS. 3A and 3B, the overall size of the bias circuit and the drain filter is very similar to the commonly used "sense FET". It is noted that, in case of a discrete die, increasing the size of the bias circuit translates to a decrease in the available space for the RF transistor, which in turn translates to a reduction of power density.

Implementation within an MMIC is straightforward for a skilled reader and external connections (to class AB and Vctrl signals for examples) are easy to implement. Detailed description of such details is therefore omitted.

Figure 4:
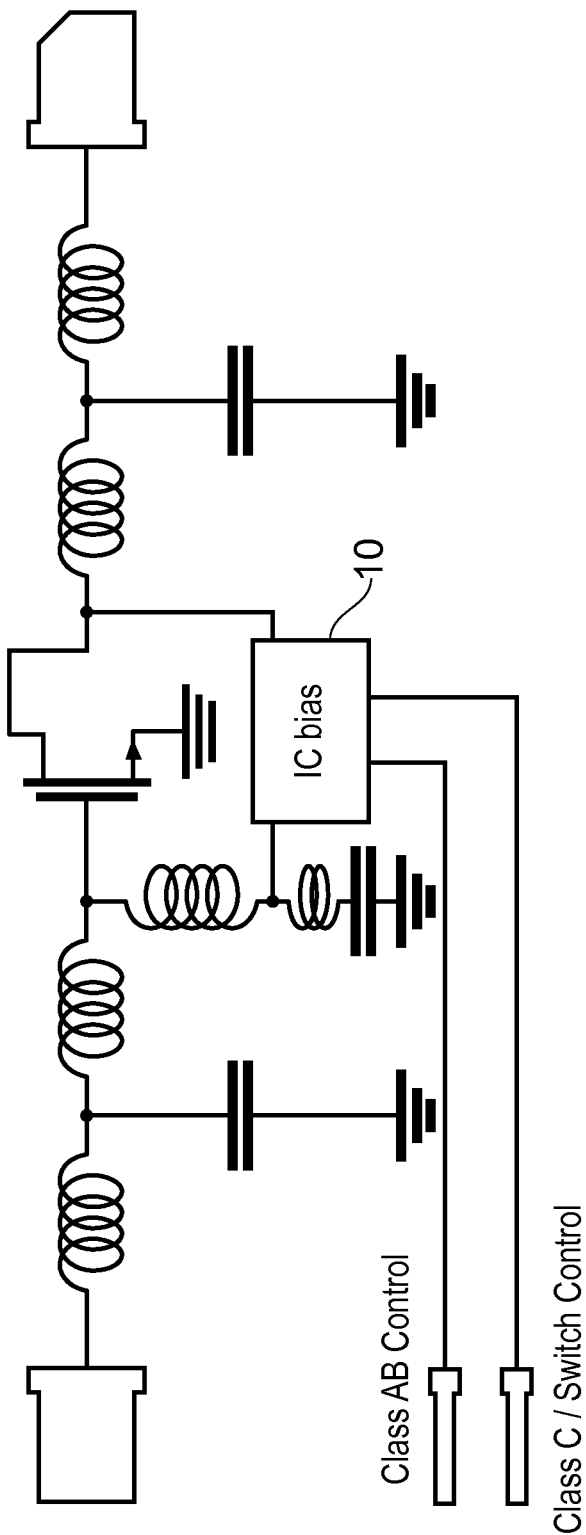
FIG. 4 illustrates a transistor topology including a bias circuit according to an embodiment.

For the example of a discrete transistor, an example of transistor topology including a bias circuit according to an embodiment is illustrated in FIG. 4, wherein input prematch circuit includes a shunt inductance decoupled by a high value capacitor and a low-pass filter. Note that use of the shunt inductance with decoupling capacitor allows increasing RF bandwidth of the transistor, but is currently not used because it prevents fast switching of the bias (overall input capacitance too high). Embodiments allow use of wideband matching while maintaining fast switching capability.

Figure 5:
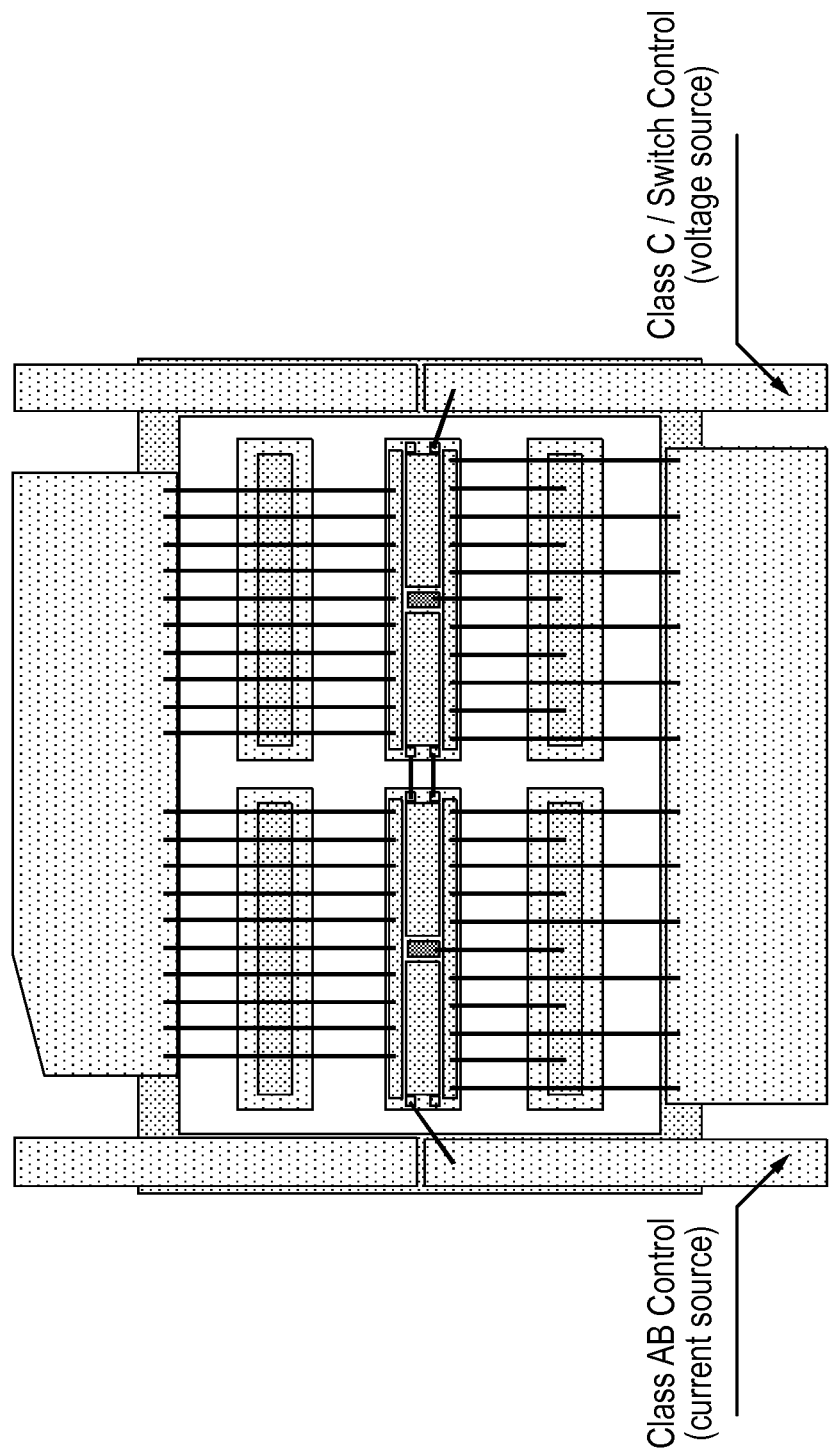
FIG. 5 shows the implementation of an embodiment within a regular discrete package.

Implementation of an embodiment within a regular discrete package is shown in FIG. 5. Here, the leads usually dedicated to the sense FET connections are used as the input for the Class AB and control voltage Vctrl connections. The output leads are free for any kind of Video Bandwidth optimization at the output (the input Video Bandwidth being assured by the low impedance of the integrated bias).

Figure 6B:
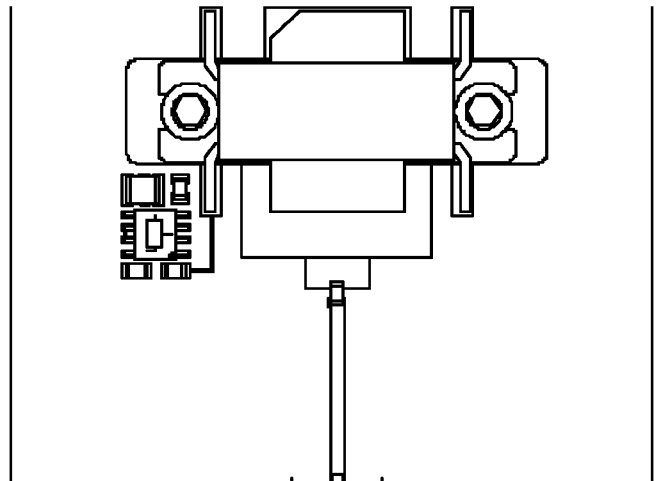
FIG. 6B shows a bias arrangement according to a proposed embodiment.
Figure 6A:
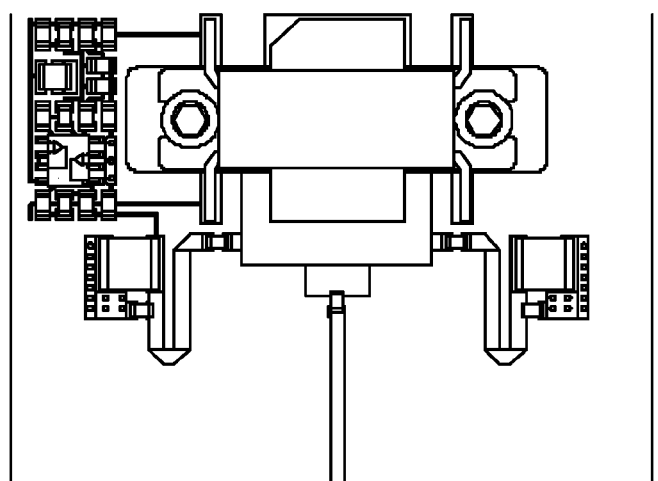
FIG. 6A shows a conventional bias arrangement using a sense FET.

On top of the fact that providing low video impedance allows for improved "linearizability" and that "switchability" is preferred for many applications, the space savings provided by embodiment can be significant. Such potential space savings are is illustrated in FIG. 6, wherein FIG. 6a shows a conventional bias arrangement using a sense FET, and FIG. 6b shows a bias arrangement according to a proposed embodiment.

While one or more embodiments have been illustrated in detail, one of ordinary skill in the art will appreciate that modifications and adaptations to those embodiments may be made.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. A bias circuit for a transistor in a C class amplifier, the bias circuit comprising:
    a class AB amplifier bias voltage generating means adapted to generate a bias voltage at an output terminal; and
    a transistor connected between the output terminal and a first reference voltage, the control terminal of the transistor being connected to a second reference voltage via a switch,
    wherein closure of the switch connects the second reference voltage to the control terminal of the transistor to cause a shift in the bias voltage generated by the class AB amplifier bias voltage generating means to achieve a predetermined class C bias voltage at the output terminal.

2. The bias circuit of claim 1, wherein a first resistor is connected between the control terminal of the transistor and the switch, and a second resistor is connected between the control terminal of the transistor and the output terminal.

3. The bias circuit of claim 1, wherein the class AB amplifier bias voltage generating means comprise a current mirror circuit.

4. The bias circuit of claim 3, wherein the current mirror circuit comprises first and second MOS transistors provided in a looped arrangement, wherein the drain of the first MOS transistor is connected to a current source IREF, wherein a voltage source is connected to the drain of the second MOS transistor, and wherein the gate of the second MOS transistor is connected to the drain of the first MOS transistor, such that the source of the second MOS transistor provides the bias voltage.

5. The bias circuit of claim 1, wherein the bias circuit is an integrated circuit.

6. The bias circuit of claim 5, wherein the bias circuit is integrated on the same circuit as the transistor to be biased.

7. The bias circuit of claim 5, wherein the second reference voltage (Vctrl) is provided externally to the bias circuit.

8. The bias circuit of claim 1, wherein the first reference voltage is a ground voltage.

9. A Doherty amplifier bias circuit comprising a bias circuit according to claim 1.

10. A radio frequency amplifier circuit comprising a bias circuit according to claim 1.

11. A method of biasing a transistor in a C class amplifier, using a bias circuit comprising: a class AB amplifier bias voltage generating means; and a transistor connected between the output terminal and a first reference voltage, the control terminal of the transistor being connected to a second reference voltage via a switch, the method comprising the steps of:

generating a bias voltage at an output terminal of the bias circuit using the class AB amplifier bias voltage generating means; and activating the switch to connect the second reference voltage to the control terminal of the transistor so as to cause a shift in the bias voltage generated by the class AB amplifier bias voltage generating means to achieve a predetermined class C bias voltage at the output terminal.

12. A computer program product comprising a computer-readable storage medium having a computer readable-program code configured to perform the steps of claim 11 when executed on a processor for biasing a transistor in a C class amplifier using a bias circuit comprising: a class AB amplifier bias voltage generating means; and a transistor connected between the output terminal and a first reference voltage, the control terminal of the transistor being connected to a second reference voltage via a switch.

* * * * *